(12) United States Patent
Gauthier et al.

(10) Patent No.: US 6,879,929 B2
(45) Date of Patent: Apr. 12, 2005

(54) SENSE AMPLIFIER THERMAL CORRECTION SCHEME

(75) Inventors: Claude R. Gauthier, Cupertino, CA (US); Shaishav A. Desai, Sunnyvale, CA (US); Raymond Heald, Los Altos, CA (US)

(73) Assignee: Sun Microsystems, Santa Clara, CA (US)

( * ) Notice: Subject to any disclaimer, the term of this patent is extended or adjusted under 35 U.S.C. 154(b) by 0 days.

(21) Appl. No.: 10/285,809

(22) Filed: Oct. 31, 2002

(65) Prior Publication Data

US 2004/0088134 A1 May 6, 2004

(51) Int. Cl.[7] .............................. G01K 1/08; G06F 15/00
(52) U.S. Cl. ..................... 702/132; 702/99; 702/130; 330/296; 330/298
(58) Field of Search .............................. 702/64, 85, 91, 702/99, 106, 130, 132; 327/52, 57, 63, 513; 330/310, 290, 296, 298, 289

(56) References Cited

U.S. PATENT DOCUMENTS

| | | | | |
|---|---|---|---|---|
| 4,742,312 A | * | 5/1988 | Osburn et al. | 330/298 |
| 5,784,328 A | * | 7/1998 | Irrinki et al. | 365/222 |
| 6,037,807 A | * | 3/2000 | Wu et al. | 327/52 |
| 6,046,642 A | * | 4/2000 | Brayton et al. | 330/296 |
| 6,078,518 A | * | 6/2000 | Chevallier | 365/185.03 |
| 2002/0066001 A1 | | 5/2002 | Olarig et al. | |

FOREIGN PATENT DOCUMENTS

| | | |
|---|---|---|
| DE | 3424003 A1 | 2/1986 |
| EP | 0 147 968 | 10/1985 |
| EP | 1 241 676 | 8/2002 |

OTHER PUBLICATIONS

Co-pending U.S. patent application 10/079,476 filed on Feb. 19, 2002 "A method and System for monitoring and profiling an integrated circuit die temperature".*
International Search Report.
Tim Regan, "Power OP Amp Has Built-In Fault Protection", New Electronics, vol. 19, No. 22 Nov. 1986 GB International Thomson Publishing, London.

* cited by examiner

Primary Examiner—Bryan Bui
(74) Attorney, Agent, or Firm—Martine & Penilla LLP (57) ABSTRACT

A system and method of adjusting a sense amplifier includes providing an amplification control parameter to the sense amplifier. A temperature of the sense amplifier is monitored and the amplification control parameter to the sense amplifier is adjusted according to the temperature of the sense amplifier.

22 Claims, 7 Drawing Sheets

SENSE AMPLIFIER THERMAL CORRECTION SCHEME

CROSS REFERENCE TO RELATED APPLICATIONS

This application is related to U.S. patent application Ser. No. 10/079,476 filed on Feb. 19, 2002 and entitled "Method and System for Monitoring and Profiling Integrated Circuit Die Temperature," by inventors Spencer Gold, Claude Gauthier, Steven Boyle, Kenneth House and Joseph Siegel, which is incorporated herein by reference in its entirety.

BACKGROUND OF THE INVENTION

1. Field of the Invention

The present invention relates generally to sense amplifiers, and more particularly, to methods and systems for dynamically optimizing sense amplifier performance for the current, local temperature of the sense amplifier.

2. Description of the Related Art

Figure 1:
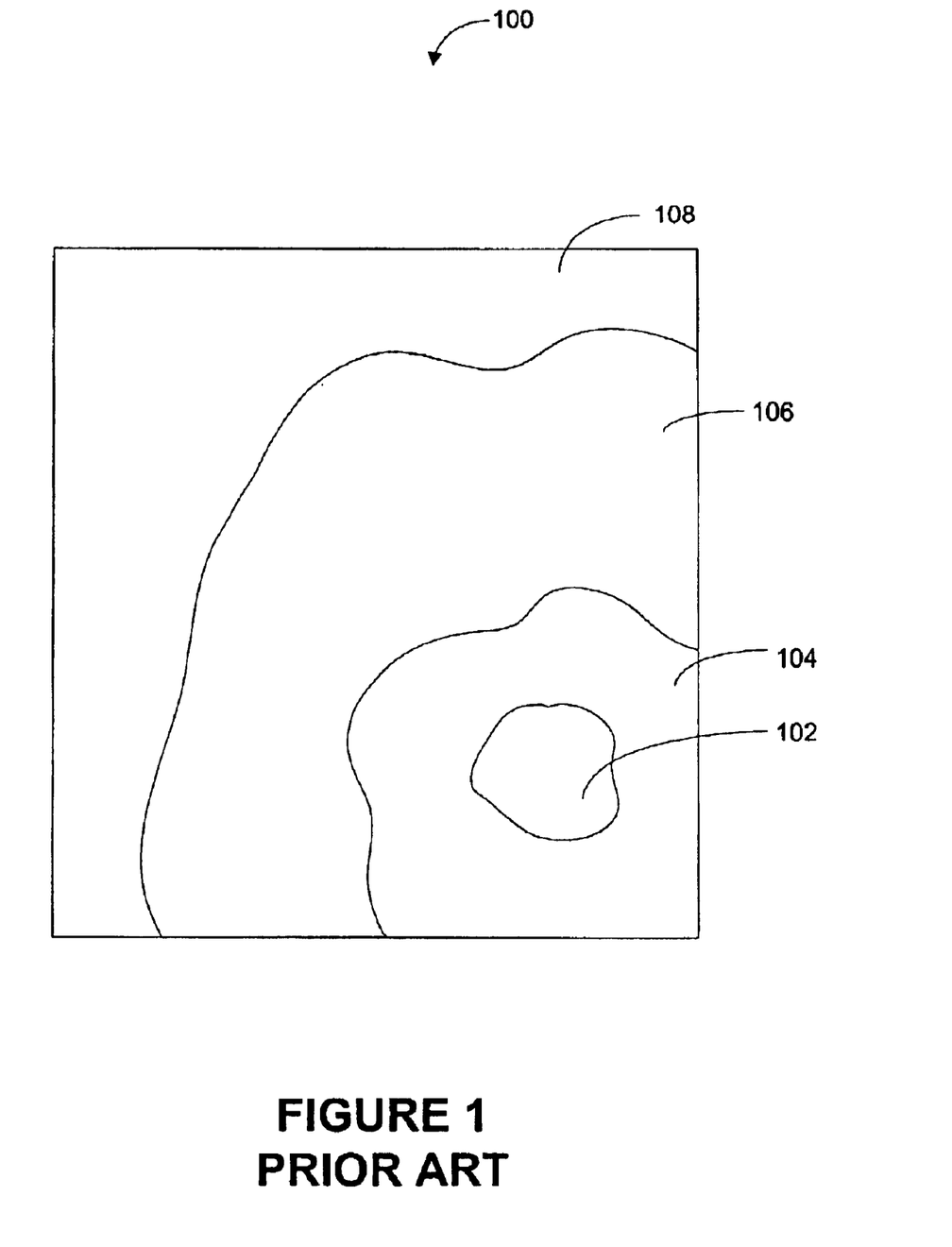
FIG. 1 shows a temperature gradient across a typical microprocessor die.

Integrated circuits (ICs) typically have thermal gradients across the IC. The thermal gradients are typically caused by different functions being carried out in one portion of the IC than in another portion of the IC because the different functions can lead to variations in power dissipation across the IC. FIG. 1 shows a temperature gradient across a typical microprocessor die 100. The hottest area 102 can have a relatively high operating temperature such as about 105 degrees C. or higher. An adjacent area 104 is slightly cooler at approximately 80 degrees C. An even cooler area 106 is approximately 50 degrees C. The remaining area 108 is approximately 20 degrees C.

The hottest area 102 can include portions of the core processor unit, which performs functions nearly every clock cycle. By comparison, some of the ancillary portions of the microprocessor die 100 such as memory registers and other, non-core functions are operate at cooler temperatures because these ancillary portions may not perform a function every clock cycle or for other reasons described below. As a result, these ancillary portions are typically cooler areas of the microprocessor die 100.

Some portions of the microprocessor die 100 may also have higher device densities than other portions of the microprocessor die 100. The higher density portions, such as the processing core, would typically have a higher temperature than less dense areas 104, 106, 108, because more operations and current flow occurs in higher device density areas. Therefore a temperature gradient can often result between the different areas 102, 104, 106, 108 of the microprocessor die 100.

One of the problems with having the temperature gradient across an IC is that sense amplifiers that are used to read a memory register, or any other type of memory device, are typically designed for the worst-case operating temperature. For example, if a first portion of an IC is an area that operates at about 105 degrees C. and includes about 2–5 percent of the sense amplifiers. A second portion of the IC operates at 20 degrees C., and includes 95–98 percent of the sense amplifiers. Therefore, in the worst-case operating temperature across the IC is the 105 degrees C. and all of the sense amplifiers in the entire IC are typically designed to operate in the range of 105 degrees C. As a result, the performance of 95–98 percent of the sense amplifiers is not optimized for their typical operating conditions.

Sense amplifiers are typically constructed from MOS transistors (NMOS and PMOS). The current flow, $I_d$ through a saturated MOS transistor can determined by the following relationship:

$$I_d = \frac{1}{2} * u * C_{ox} * W/L * (V_{gs} - V_t)^2 \qquad \text{Relationship 1}$$

u is the mobility of electrons in NMOS (or holes in PMOS). $C_{ox}$ is the gate electrode capacitance. W/L are the physical dimensions of the device. $V_{gs}$ is the gate-source voltage applied across the gate-source junction. $V_{gs}$ is equal to bias voltage as will be described below. $V_t$ is the turn-on, or threshold voltage. By way of example, as temperature goes up, the mobility parameter will shift according to the following relationship:

$$u = u_o (300/T)^{3/2} \qquad \text{Relationship 2}$$

$u_o$ is the mobility of electrons (or holes) @ 300 Kelvin. As T goes up, u goes down. Also as u goes down, physically larger device dimensions (W/L) are required to maintain the same level of current as shown above in Relationship 1. However, when larger devices are used, the relative current must be increased even more due to the additional capacitance resulting from the physically larger devices. Capacitance is typically proportional to physical area of the devices.

As shown in Relationships 1 and 2 above, a sense amplifier designed to operate at 105 degrees C. cannot detect or resolve voltage differences (i.e., switch) as quickly as a sense amplifier that is designed to operate at 20 degrees C. (when operated at 20 degrees C.), with the same current flow, because the larger devices were required in the design targeted for higher temperature operation. A higher current flow is required to match the switching speed. Therefore, the result of having all the sense amplifiers designed for the worst-case operating temperature (i.e., 105 degrees C.), is that the overall performance of all the sense amplifiers is degraded. Further, a sense amplifier designed to operate at 105 degrees C. uses physically larger devices (i.e., have a larger area) than a sense amplifier designed to operate at 20 degrees C. Physically larger devices also have larger node capacitances and also require a greater operating current in the sense amplifier and in the constant current source, than a similar sense amplifier that is designed to operate at 20 degrees C.

The time required for a sense amplifier to switch (i.e., switching time ($\Delta T$)) is defined by the following relationship:

$$\Delta V = (I * \Delta T)/C \qquad \text{Relationship 3}$$

Where $\Delta V$ is the change in voltage across the capacitance C of a node and I is a charging or discharging current across the capacitance C. As shown in Relationship 3 above, the switching time is proportional to the capacitance of the node or device junction in the sense amplifier. Therefore, as the capacitance increases the switching time also increases.

Designing all sense amplifiers to operate at 105 degrees C. when not all sense amplifiers will actually operate at 105 degrees C. will unnecessarily increase the size of the devices required, increase the internal node capacitances leading to increased switching time. Further, the larger device sizes of the sense amplifiers to operate at 105 degrees C. limit the possible locations of the sense amplifiers.

Further, a physically larger device consumes more current to function at a cooler temperature than a smaller device at the same cooler temperature. By way of example, in a typical IC, a sense amplifier designed to operate at 105 degrees C. may consume 200 microampere at 105 degrees C. (the worst case temperature) to switch in time T. The same sense amplifier circuit operated at a lower temperature (e.g., 20 degrees C.) will draw excess current, as shown in Relationship 1 above, and will also switch faster than required under worst case conditions. Therefore, if all sense amplifiers are designed to operate at 105 degrees C. when only about 2 percent are actually operating at 105 degrees, then the remaining 98 percent are consuming excess current which is inefficient from a power perspective in addition.

Another problem specific to some ICs, such as a microprocessor and other processor-type ICs is that depending upon the actual function being performed, the temperature gradients may migrate around the IC. For example, a first portion of the IC may be very hot when performing a first function. Alternatively, when the IC is performing second function, the first portion may be substantially cooler because another portion of the IC is performing the bulk of the second function. Therefore, it is not efficient to design sense amplifiers in a first portion of the IC to be optimized for operating at 20 degrees C. and sense amplifiers in a second portion of the IC to be optimized for operating at 105 degrees C. when the actual operating temperatures of each portion of the IC can vary significantly.

Further still, as device densities have increased, the temperature gradients have similarly increased. By way of example, some current generations of ICs have temperature gradients as much as 50 degrees C. or more across the IC. In one current generation CPU the operating temperature can be 105 degrees C. or hotter in the hotter portions of the CPU and 50 degrees C. or less in the "cooler" portions of the CPU. Designing sense amplifiers throughout the entire CPU to operate at 105 degrees C. is very inefficient use of power and also results in slower switching (i.e., lower speed) sense amplifiers, which degrades overall CPU performance.

Figure 2:
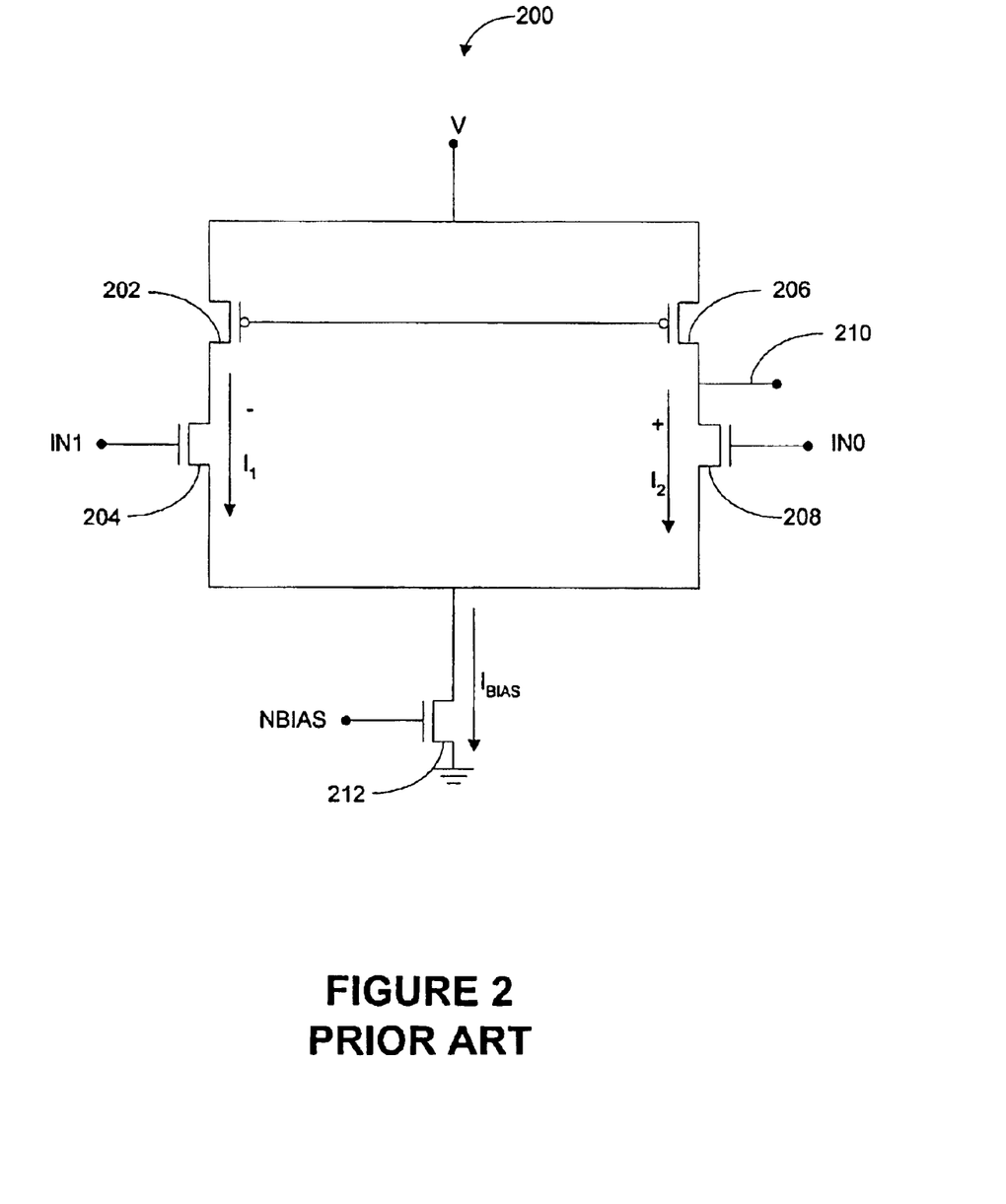
FIG. 2 is a schematic of a typical sense amplifier.

Typically the registers and memory locations are spread throughout an IC. One or more sense amplifiers are co-located with each memory cell (or set of memory cells). FIG. 2 is a schematic of a typical sense amplifier 200. The sense amplifier 200 is a typical differential-type amplifier that is capable of resolving small voltage differences and producing a large output voltage. The sense amplifier 200 includes four transistors 202, 204, 206, 208.

The performance of the sense amplifier 200 is controlled by several amplification control parameters such as bias voltage and bias current. Transistor 212 provides a constant current source that is controlled by a bias voltage applied to the gate of transistor 212. As shown transistor 212 is an n-type device so therefore the bias voltage is an Nbias. The bias voltage is typically supplied by an bias voltage source that is local to the particular sense amplifier 200 or a set of sense amplifiers. The bias voltage is a nominal constant voltage from the bias voltage source. The actual bias voltage required is dependant on the type of device. In one typical device, the bias voltage is typically 0.5 VDC. The bias voltage biases transistor 212 at saturation so as to conduct a constant current $I_{BIAS}$.

Constant current $I_{BIAS}$ is equal to the sum of $I_1$ and $I_2$ flowing across transistors 204 and 208, respectively. While the sum of $I_1$ and $I_2$ is constant, current $I_1$ is greater than $I_2$ if the voltage is applied to the gate of transistor 204 is greater than the voltage applied to the gate of transistor 208. Conversely, current $I_2$ is greater than $I_1$ if the voltage is applied to the gate of transistor 208 is greater than the voltage applied to the gate of transistor 204. An output signal is taken from output terminal 210.

The gain ($A_v$) of the sense amplifier 200 is equal to the product of resistance ($R_L$) of the load transistors 202, 206 and the trans-conductance (gm) of the input transistors 204, 208. The slew rate (i.e., switching time) of the sense amplifier 200 is dependant on the ratio of the $I_{BIAS}$ and the output capacitance ($C_O$). Therefore, a changing in the bias current $I_{BIAS}$ can change the slew rate (i.e., increase or decrease the switching time) and the gain ($A_v$) of the sense amplifier 200. Similarly, a change in the bias voltage can change the bias current $I_{BIAS}$.

In view of the foregoing, there is a need for a system and method for adjusting the amplification control parameters for each sense amplifier according to the local thermal characteristics of the sense amplifier.

SUMMARY OF THE INVENTION

Broadly speaking, the present invention fills these needs by a dynamically optimizing sense amplifier performance for the current, local temperature of the sense amplifier. It should be appreciated that the present invention can be implemented in numerous ways, including as a process, an apparatus, a system, or a device. Several inventive embodiments of the present invention are described below.

A system and method of adjusting a sense amplifier includes providing an amplification control parameter to the sense amplifier. A temperature of the sense amplifier is monitored and the amplification control parameter to the sense amplifier is adjusted according to the temperature of the sense amplifier.

The amplification control parameter can include a bias voltage. In one embodiment, the bias voltage can be provided by an adjustable bias voltage source.

Alternatively, the amplification control parameter can include a bias current.

In one embodiment, a temperature monitoring system monitors the temperature of the sense amplifier and adjusting the amplification control parameter to the sense amplifier according to the temperature of the sense amplifier can include determining a temperature correction signal and applying the temperature correction signal to the adjustable bias source.

Determining the temperature correction signal can include providing a look-up table that includes at least two temperatures and a corresponding temperature correction signal for each of the least two temperatures.

Alternatively, determining the temperature correction signal can include providing a look-up table that includes a first temperature and a second temperature. A first temperature correction signal that corresponds to the first temperature and a second temperature correction signal that corresponds to the second temperature are also included in the look-up table. If the temperature of the sense amplifier is a third temperature that is between the first temperature and the second temperature, and a third temperature correction signal corresponds to the third temperature, the third temperature correction signal can be interpolated from the first temperature and the second temperature correction signal.

In one embodiment, applying the temperature correction signal to the adjustable bias source includes outputting an n-bit temperature correction signal from the temperature monitoring system. The n-bit temperature correction signal is received in the adjustable bias source. Adjusting the bias voltage to the sense amplifier according to the temperature of the sense amplifier can include converting the n-bit temperature correction signal in the adjustable bias source to an adjust voltage. The adjust voltage can be added to a constant voltage to produce an adjusted bias voltage.

In another embodiment, an integrated circuit includes multiple sense amplifiers that are distributed about the integrated circuit. Each one of the sense amplifiers includes a control input. A distributed temperature sensor system that is capable of monitoring multiple, local temperatures that correspond to each of the sense amplifiers. The distributed temperature sensor system also has an output coupled to the control input of the corresponding sense amplifiers.

The distributed temperature sensor system can include a processor that has a control output signal that is coupled to the control input of each of the corresponding, sense amplifiers. The distributed temperature sensor system can also include multiple temperature sensors that each are co-located with at least one sense amplifier. The temperature sensors are coupled to the processor and the control output signal corresponds to the local temperature of the corresponding sense amplifier. The processor can be external to the integrated circuit.

In one embodiment, the distributed temperature sensor system can output a digital control input signal to the control input of each of the least one corresponding sense amplifiers.

Each of the sense amplifiers can include an adjustable current source. Each one of the adjustable current sources includes a bias input. Each of the sense amplifiers also includes a adjustable bias source that has an output coupled to the corresponding bias input. Each of the corresponding, adjustable bias sources includes a bias control input coupled to the sense amplifier control input. The bias input can determine a current flow through the current source.

Each of the corresponding, adjustable bias sources can include a constant voltage circuit and a voltage adjuster. An output of the constant voltage circuit and an output of the voltage adjuster are coupled to the adjustable bias source output. The constant voltage circuit can include a voltage divider. The voltage adjuster can include a digital to analog converter. The voltage adjuster can be capable of receiving a digital control signal from the distributed temperature sensor system and outputting an adjusting voltage.

In one embodiment, the adjustable bias source output voltage equals a sum of the output voltage of the constant voltage circuit and the adjusting voltage.

One embodiment includes a microprocessor that includes multiple sense amplifiers that are distributed about the microprocessor. Each one of the sense amplifiers can include an adjustable current source. Each one of the adjustable current sources has a bias input. Each of the sense amplifiers includes a corresponding, adjustable bias source that has an output coupled to the corresponding bias input. Each of the corresponding, adjustable bias sources has a control input. The microprocessor can also include a distributed temperature sensor system capable of monitoring multiple local temperatures that correspond to each of the sense amplifiers and have an output coupled to the control input of the corresponding adjustable bias sources.

The present invention provides the advantage of dynamically adjusting the operation of the sense amplifiers according to the local temperature of each of the sense amplifiers.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION OF THE EXEMPLARY EMBODIMENTS

Several exemplary embodiments for dynamically optimizing sense amplifier performance for the current, local temperature of the sense amplifier will now be described. It will be apparent to those skilled in the art that the present invention may be practiced without some or all of the specific details set forth herein.

Figure 3A:
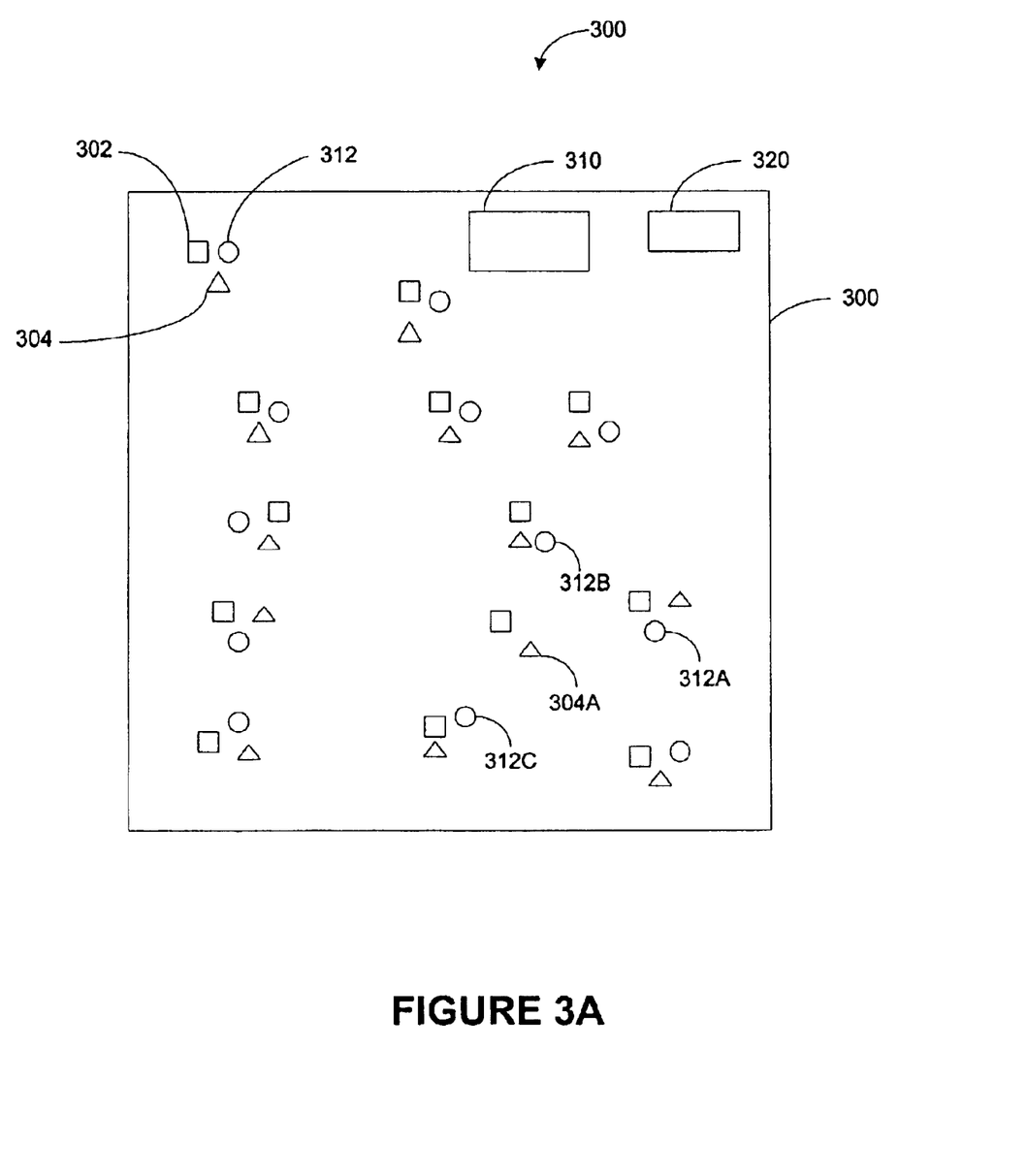
FIG. 3A shows a block diagram of an IC die that includes a distributed temperature monitoring system, according to one embodiment of the present invention.

FIG. 3A shows a block diagram of an IC die 300 that includes a distributed temperature monitoring system, according to one embodiment of the present invention. Multiple bias voltage sources 302 are represented by multiple small squares that are distributed around the IC die 300. The multiple bias voltage sources 302 are distributed around the IC die 300 so as to be local to various sense amplifiers 304 (or sets of sense amplifiers) that are also distributed around the IC die 300. The various sense amplifiers 304 are represented by triangles.

The temperature monitoring system includes a temperature monitoring unit or processor or controller 310 and multiple temperature sensors 312 that are distributed around the IC die 300. The multiple temperature sensors 312 may be co-located with the multiple sense amplifiers 304. Alternatively, if a temperature sensor is not co-located with a sense amplifier such as sense amplifier 304A, then a local temperature of sense amplifier 304A can be approximated by the temperature monitoring unit 310, and the detected temperature from one or more temperature sensors 312A–C that are nearby the sense amplifier 304A.

The temperature monitoring unit 310 can be a specially designed portion of the IC die 300 or maybe included in another functional portion of the IC die 300. By way of example, if the IC die 300 is a microprocessor, the processing portion of the temperature monitoring unit 310 may be included in the main processing core of the microprocessor. In an alternative embodiment, the temperature monitoring unit 310 can be external to the IC die 300 such as in a peripheral IC or even an IC remotely coupled to the IC die 300 by a communications network such as a computer network.

Additional details of the temperature monitoring system are described in commonly owned U.S. patent application Ser. No. 10/079,476 filed on Feb. 19, 2002 and entitled "Method and System for Monitoring and Profiling Integrated Circuit Die Temperature," by inventors Spencer Gold, Claude Gauthier, Steven Boyle, Kenneth House and Joseph Siegel, which is incorporated by reference herein, in its entirety.

Figure 3B:
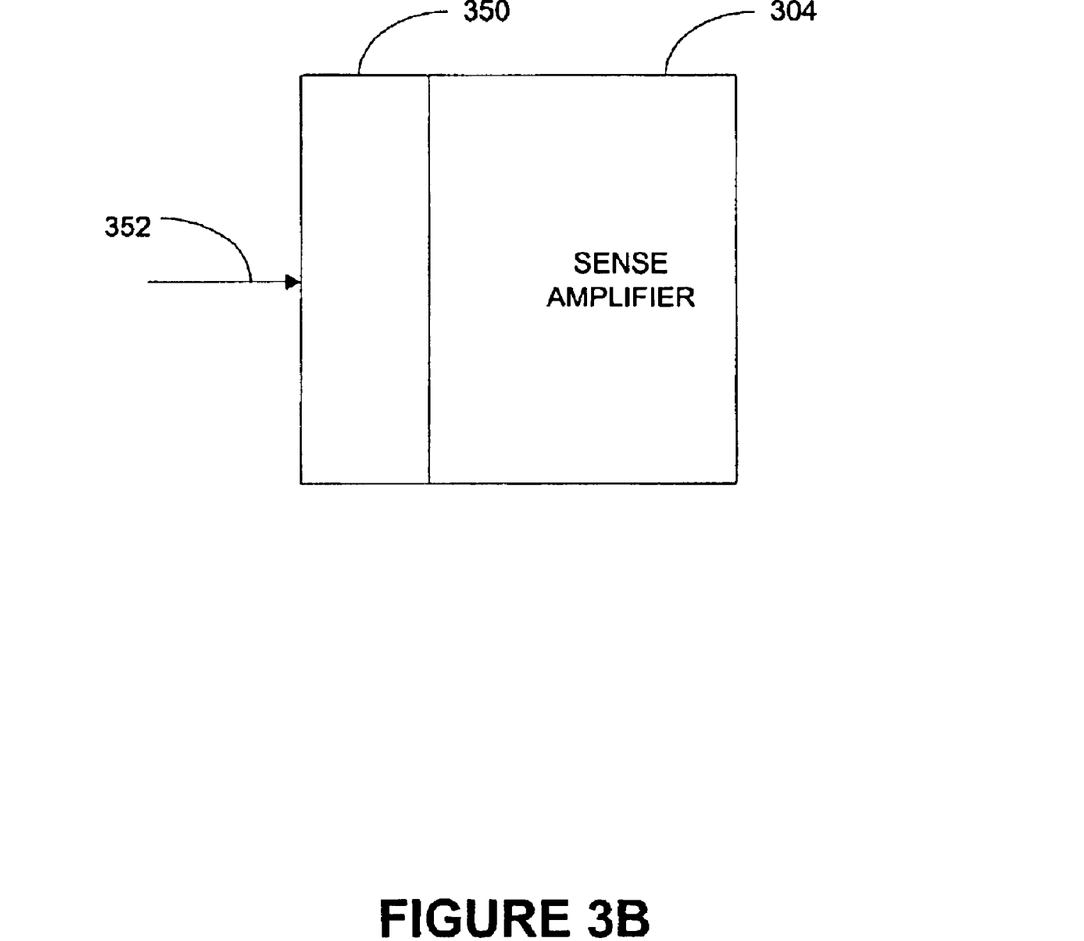
FIG. 3B is a block diagram of a sense amplifier in accordance with one embodiment of the present invention.
Figure 4:
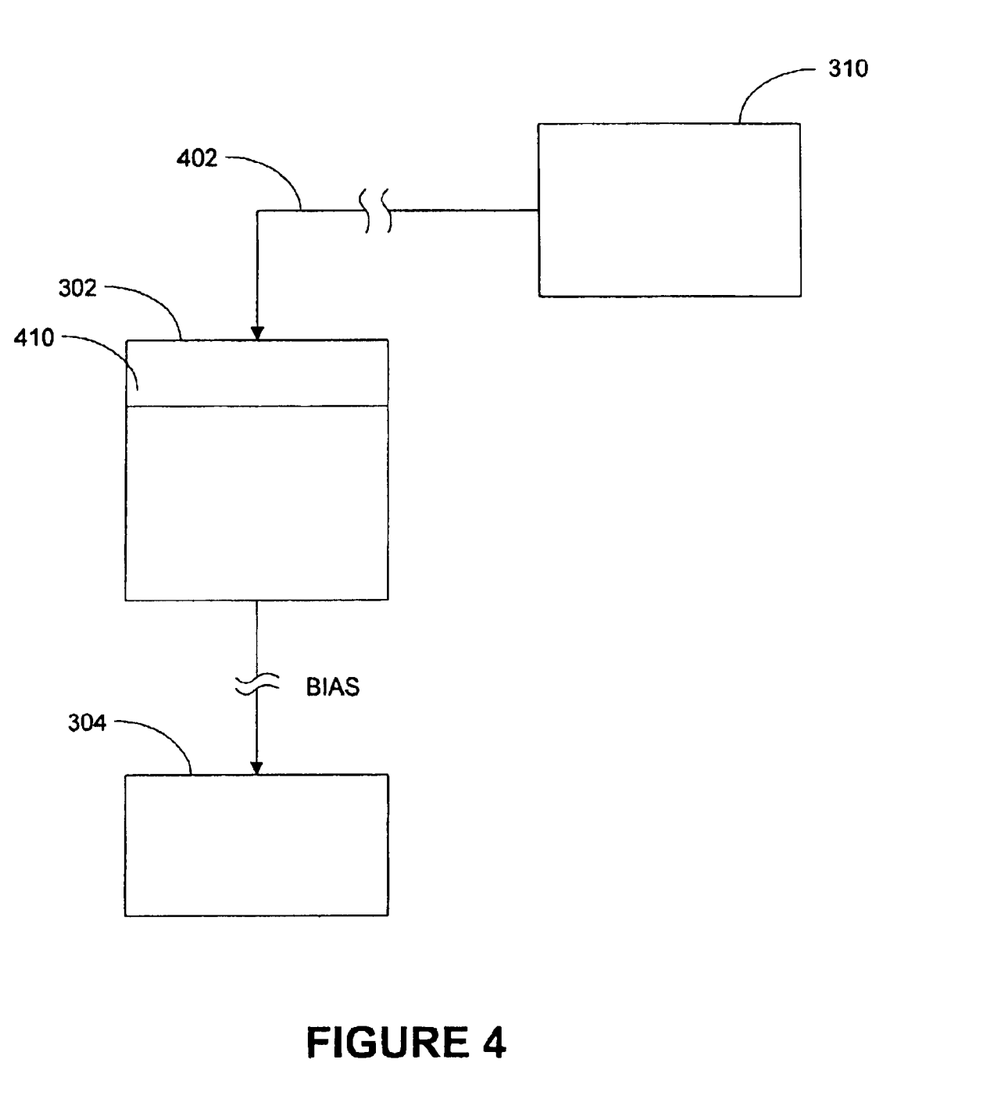
FIG. 4 shows a block diagram of the interconnections between a temperature monitoring unit, an bias voltage source and a sense amplifier according to one embodiment of the present invention.
Figure 5:
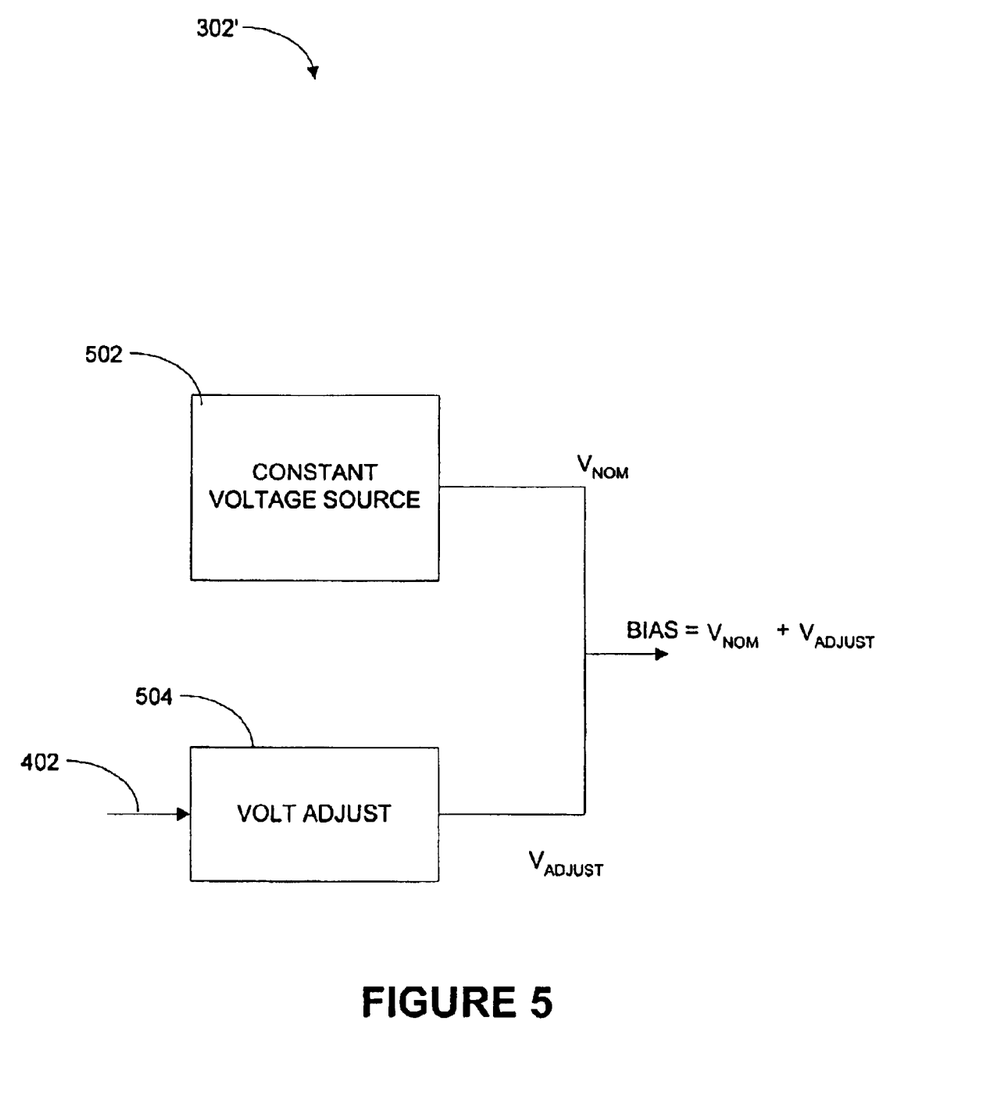
FIG. 5 is a block diagram of an bias voltage source 302' according to one embodiment of the present invention.

FIG. 3B is a block diagram of a sense amplifier 304 in accordance with one embodiment of the present invention. The sense amplifier 304 can be coupled to a sense amplifier controller 350. The sense amplifier controller 350 includes a control input 352. The control input 352 can be connected to the temperature monitoring system. The temperature monitoring system can output a local temperature correction signal to the sense amplifier controller 350. The sense amplifier controller 350 can adjust the operation of the sense amplifier 304 by adjusting the amplification parameters of the sense amplifier 304. FIGS. 4 and 5 below describe embodiments where the sense amplifier controller 350 includes a bias voltage source 302 and adjusts the bias voltage to adjust the operations of the sense amplifier 304 according to the local temperature. However, in alternative embodiments, the sense amplifier controller 350 can also the bias current source and adjust the bias current or other amplification parameters to adjust the operations of the sense amplifier 304 according to the local temperature.

FIG. 4 shows a block diagram of the interconnections between a temperature monitoring unit 310, a bias voltage source 302 and a sense amplifier 304 according to one embodiment of the present invention. The temperature monitoring unit 310 receives the corresponding temperature from each of the temperature sensors 312. The temperature monitoring unit 310 can then output a corresponding temperature correction signal to each of the multiple bias voltage sources 302. Each of the multiple bias voltage sources 302 can adjust the respective output bias voltage in response to the received temperature correction signal.

The bias voltage source 302 can be coupled to the temperature monitoring unit 310 by way of a bus or other commonly known methods. The bus between the temperature monitoring unit 310 and the bias voltage source 302 can be a dedicated bus or a bus that is shared by the various bias voltage sources 302 and possibly other devices (not shown). Each bias voltage source 302 can also include an address such that a particular temperature correction signal 402 can also include an address portion that corresponds with a particular bias voltage source 302 so that the particular temperature correction signal 402 can be addressed to a particular bias voltage source 302. This allows individual adjustment of each of the bias voltage sources 302 according to the corresponding local temperature of the bias voltage sources 302 so that all bias voltage sources are not given the same temperature correction signal.

The bias voltage source 302 outputs an adjusted bias voltage to the sense amplifier 304 in response to the temperature correction signal 402. The bias voltage source 302 can use any system or method known in the art to use the temperature correction signal 402 to control the variable, output bias voltage. The temperature correction signal 402 can be a digital or an analog signal.

In one embodiment the bias voltage source 302 includes a digital to analog (D/A) converter 410 to convert a digital n-bit temperature correction signal 402. In another example, a D/A converter 410 can convert a digital, n-bit temperature correction signal 402 to an analog bias signal used to produce the variable output bias voltage. Alternatively, the D/A converter 410 can include a look-up table to reference a bias voltage level that is used to produce the desired output bias voltage. By way of example, a temperature correction signal 402 of "10110001" corresponds, in a lookup table, to a voltage of 0.3075 VDC so that the output voltage of the bias voltage source 302 will be adjusted to produce a temperature corrected current in the constant current source of the corresponding sense amplifier (or amplifiers).

Alternatively, the temperature correction signal 402 could be the actual local temperature of the bias voltage source 302 and the temperature correction signal 402 can be correlated to a voltage in a look-up table. Conversely, temperature monitoring unit 310 can determine the precise temperature correction signal 402 such as by way of a look-up table or according to an algorithm or other methods known in the art. The resulting temperature correction signal 402 can be provided to the D/A converter 410, which directly converts the received temperature correction signal 402 to an analog biasing or adjusting signal for the bias voltage source 302. In one embodiment the temperature correction 402 signal is determined by an algorithm for interpolating between two known temperatures. For example a first temperature correction signal corresponds to operating a particular NBIAS source 302 at 25 degrees C. A second temperature correction signal corresponds to operating the particular bias voltage source 302 at 105 degrees C. If a detected actual temperature is 65 degrees C., then some manner of interpolation is required to determine a corresponding temperature correction signal. In one embodiment a simple linear scale could be used. Alternatively a non-linear scale could be used. The type of scale selected could be determined by one or more parameters of the IC die 300.

The precise values to the look-up tables and temperature processing algorithms described above can be determined by one or more parameters of the IC die 300. In one embodiment the parameters are included or stored on the IC die 300, such as in an EEPROM 320 portion of the IC die 300, or other methods of recording the parameters on or in the IC die 300 or in accompanying integrated circuits or software, that could be read by the temperature monitoring unit 310. The parameters of the IC die 300 can include temperature performance and capability factors such as may be determined in production testing. The parameters of the IC die 300 can be stored in the EEPROM 320 portion as part of the production cycle. By way of example, upon initial power up of the IC die 300, the temperature monitoring unit 310 can read the parameters of the IC die 300 from the EEPROM 320 portion so that appropriate temperature correction techniques can be applied to the various locales of the IC die 300. The above example methods are intended to be examples only and the invention should not be limited to these embodiments.

FIG. 5 is a block diagram of an bias voltage source 302' according to one embodiment of the present invention. A constant voltage source 502 produces a constant nominal voltage out $V_{nom}$. A voltage adjuster 504 is coupled in parallel with the constant voltage source 502. The voltage adjuster 504 receives the temperature correction signal 402 and outputs a $V_{adjust}$ voltage. An output bias voltage is equal to the sum of $V_{adjust}$ and $V_{nom}$. In this embodiment, $V_{nom}$ is a setpoint voltage about which the temperature correction signal 402 adjusts the output bias voltage. The value of $V_{nom}$ is dependant on the particular semiconductor device type and material. By way of example in one type of semiconductor device, the $V_{nom}$ is equal to about 0.25 VDC and $V_{adjust}$ is equal to about +/−0.075 VDC yielding a range of bias voltage from about 0.175 VDC to about 0.325 VDC.

Rather than adjusting bias voltage above and below a set point voltage, an alternative bias voltage source 302' could be an adjustable voltage source that is independent of a particular setpoint.

The bias voltage source 302 varies the bias voltage to compensate for the local temperature characteristics of the local sense amplifier(s) 304 that the bias voltage source 302 supplies bias voltage to. The result is the bias voltage for the sense amplifier 304 is adjusted slightly up or down which slightly changes the current "constant current" $I_{BIAS}$ for the sense amplifier. The adjusted $I_{BIAS}$ for the sense amplifier 304 adjusts the slew rate and the gain according to the temperature of the local sense amplifier.

It should be appreciated that there are multiple local sets of bias voltage sources 302 and corresponding sense amplifiers 304 and that each local set of an bias voltage source 302 and one or more sense amplifiers 304 can have a different bias voltage that is optimized for the actual temperature of the one or more sense amplifiers 304.

Figure 6:
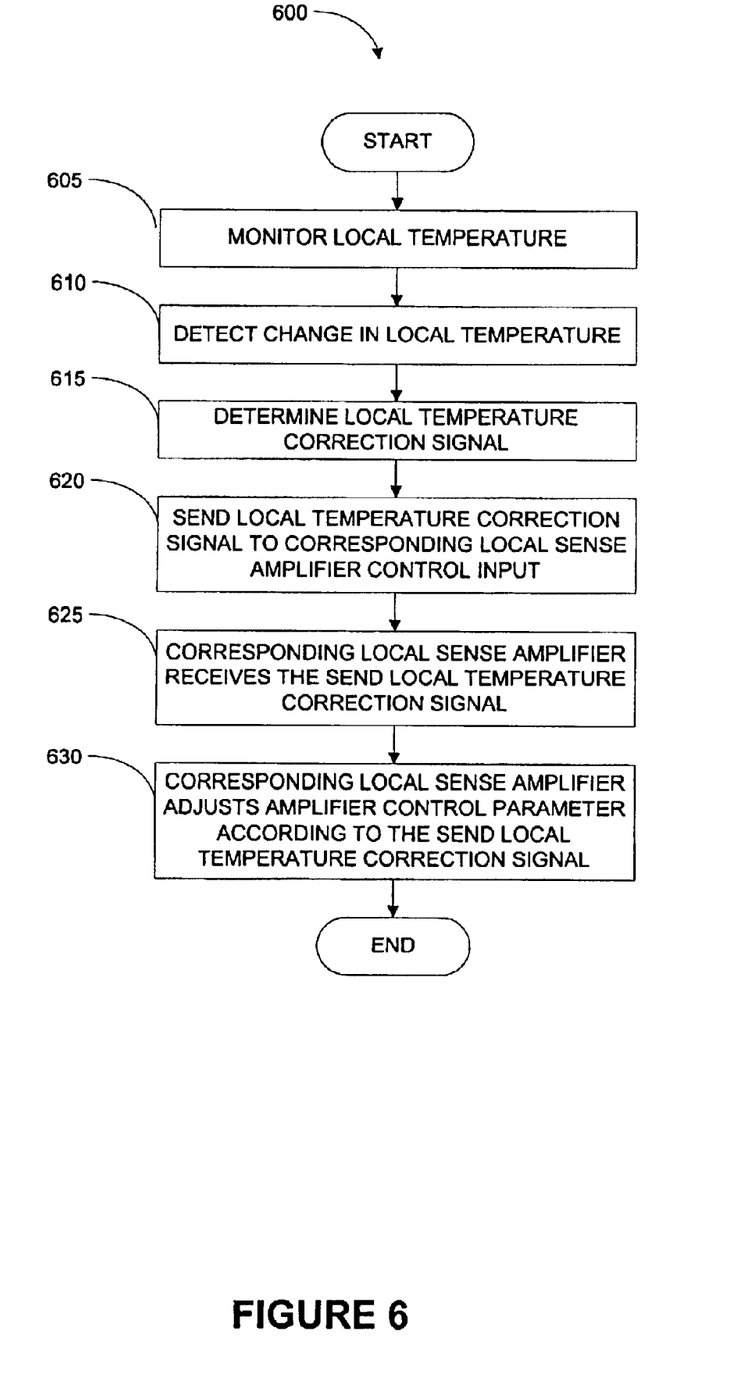
FIG. 6 is a flowchart of the method operations of optimizing the amplification control parameters for the local temperature of a sense amplifier in accordance with one embodiment of the present invention.

FIG. 6 is a flowchart of the method operations 600 of optimizing the operation of a sense amplifier according to the local temperature of the sense amplifier in accordance with one embodiment of the present invention. In operation 605, the local temperature is monitored by the temperature monitoring system such as described above. In operation 610, a change in the temperature in a local area of the IC die, that includes one or more sense amplifiers 304, is detected.

The temperature monitoring unit 310 determines a temperature correction signal 402 in operation 615. The temperature monitoring unit 310 outputs a temperature correction signal 402 to the corresponding sense amplifier controller or control input, in operation 620.

In operation 625, the temperature correction signal 402 is received in the corresponding sense amplifier. In operation 630, the sense amplifier adjusts operation according to the local temperature correction signal. In one embodiment, the local bias voltage source 302 can receive the temperature correction signal and adjust the bias voltage as described above. The adjusted bias voltage is then output to the local sense amplifier 304 so as to adjust the operation of the sense amplifier. Alternatively, the bias current or other amplification control parameters of the sense amplifier could be adjusted according to the local temperature correction signal.

While the disclosed invention is described in terms of bias voltages being used to manipulate the corresponding biased currents, it should be appreciated that in various alternative embodiments of the present invention that include various materials and device types such as a PBIAS or an NBIAS voltage could also be used to manipulate the corresponding biased currents. Further, describing the invention in terms of bias voltages are merely exemplary embodiments and are not intended to exclude alternative embodiments that include manipulating bias current of the sense amplifier or power supply of the sense amplifier or other amplification control parameters of the sense amplifier. As used herein the term "about" means +/−10%. By way of example, the phrase "about 250" indicates a range of between 225 and 275.

Various aspects of the invention can also be embodied as computer readable code on a computer readable medium. The computer readable medium is any data storage device that can store data that can be thereafter be read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices.

It will be further appreciated that the instructions represented by the operations in FIG. 6 are not required to be performed in the order illustrated, and that all the processing represented by the operations may not be necessary to practice the invention. Further, the processes described in FIG. 6 can also be implemented in software stored in any one of or combinations of the RAM, the ROM, or the hard disk drive.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method of adjusting a sense amplifier comprising:
providing an amplification control parameter to the sense amplifier;
monitoring a temperature of the sense amplifier;
producing an n-bit temperature correction signal that corresponds to the temperature of the sense amplifier; and
adjusting the amplification control parameter to the sense amplifier according to the n-bit temperature correction signal.

2. The method of claim 1, wherein the amplification control parameter includes a bias voltage.

3. The method of claim 2, wherein the bias voltage is provided by an adjustable bias voltage source.

4. The method of claim 3, wherein a temperature monitoring system monitors the temperature of the sense amplifier and adjusting the amplification control parameter to the sense amplifier according to the n-bit temperature correction signal includes:
determining the n-bit temperature correction signal.

5. The method of claim 4, wherein determining the n-bit temperature correction signal includes providing a look-up table that includes a first temperature and a second temperature and a n-bit first temperature correction signal that corresponds to the first temperature and a second n-bit temperature correction signal that corresponds to the second temperature.

6. The method of claim 4, wherein determining the n-bit temperature correction signal includes providing a look-up table that includes at least two temperatures and a corresponding n-bit temperature correction signal for each of the least two temperatures.

7. The method of claim 6, wherein if the temperature of the sense amplifier is a third temperature that is between the first temperature and the second temperature, and a third temperature correction signal corresponds to the third temperature, the third temperature correction signal being interpolated from the first temperature correction signal and the second temperature correction signal.

8. The method of claim 4, wherein the n-bit temperature correction signal is output from the temperature monitoring system.

9. The method of claim 8, wherein adjusting the bias voltage to the sense amplifier according to the temperature of the sense amplifier includes converting the n-bit temperature correction signal in the adjustable bias source to an adjust voltage.

10. The method of claim 9, wherein the adjust voltage is added to a constant voltage to produce an adjusted bias voltage.

11. The method of claim 1, wherein the amplification control parameter includes a bias current.

12. An integrated circuit comprising:
a plurality of sense amplifiers that are distributed about the integrated circuit, each one of the sense amplifiers including a control input; and
a distributed temperature sensor system capable of monitoring a plurality of local temperatures that correspond to each of the plurality of sense amplifiers and having an output coupled to the control input of the corresponding sense amplifiers, wherein the distributed temperature sensor system is capable of outputting an n-bit temperature control input signal to the control input of each of the least one corresponding sense amplifiers.

13. The integrated circuit of claim 12, wherein the distributed temperature sensor system includes:
   a processor having a control output signal that is coupled to the control input of each of the corresponding sense amplifiers; and
   a plurality of temperature sensors that each are co-located with at least one sense amplifier, the plurality of temperature sensors being coupled to the processor, wherein the control output signal corresponds to the local temperature of the corresponding sense amplifier.

14. The integrated circuit of claim 13, wherein the processor is external to the integrated circuit.

15. The integrated circuit of claim 12, wherein each of the plurality of sense amplifiers includes:
   an adjustable current source, each one of the adjustable current sources having a bias input; and
   a adjustable bias source that has an output coupled to the corresponding bias input, each of the corresponding, adjustable bias sources having a bias control input coupled to the sense amplifier control input.

16. The integrated circuit of claim 15, wherein the bias input determines a current flow through the current source.

17. The integrated circuit of claim 16, wherein each of the corresponding, adjustable bias sources includes:
   a constant voltage circuit; and
   a voltage adjuster, an output of the constant voltage circuit and an output of the voltage adjuster being coupled to the adjustable bias source output.

18. The integrated circuit of claim 17, wherein constant voltage circuit includes a voltage divider.

19. The integrated circuit of claim 17, wherein the voltage adjuster includes a digital to analog converter.

20. The integrated circuit of claim 17, wherein the voltage adjuster is capable of receiving n-bit temperature control input signal from the distributed temperature sensor system and outputting an adjusting voltage.

21. The integrated circuit of claim 20, wherein an adjustable bias source output voltage equals a sum of the output voltage of the constant voltage circuit and the adjusting voltage.

22. A microprocessor comprising:
   a plurality of sense amplifiers that are distributed about the microprocessor, each one of the sense amplifiers including an adjustable current source, each one of the adjustable current sources having a bias input, each of the plurality of sense amplifiers including a corresponding, adjustable bias source that has an output coupled to the corresponding bias input, each of the corresponding, adjustable bias sources having a control input; and
   a distributed temperature sensor system capable of monitoring a plurality of local temperatures that correspond to each of the plurality of sense amplifiers and having an output coupled to the control input of the corresponding adjustable bias sources, wherein the distributed temperature sensor system is capable of outputting an n-bit temperature control input signal to the control input of each the corresponding adjustable bias sources.

* * * * *